United States Patent [19]

Kessler, Jr. et al.

[11] 4,291,324

[45] Sep. 22, 1981

[54] SEMICONDUCTOR POWER DEVICE HAVING SECOND BREAKDOWN PROTECTION

[75] Inventors: Sebastian W. Kessler, Jr., San Mateo, Calif.; John A. Olmstead, Somerville, N.J.

[73] Assignee: RCA Corporation, New York, N.Y.

[21] Appl. No.: 161,453

[22] Filed: Jun. 20, 1980

[51] Int. Cl.³ .......................................... H01L 29/72
[52] U.S. Cl. ....................................... 357/36; 357/13; 357/34; 357/86
[58] Field of Search ..................... 357/34, 36, 86, 13, 357/28

[56] References Cited

U.S. PATENT DOCUMENTS

| | | | |
|---|---|---|---|
| 2,836,995 | 9/1974 | Wheatley | 357/86 |
| 3,337,782 | 8/1967 | Todaro | 357/86 |
| 3,358,197 | 12/1967 | Scarlett | 357/36 |
| 3,740,621 | 6/1973 | Carley | 357/43 |
| 3,936,863 | 2/1976 | Olmstead | 357/34 |
| 4,017,882 | 4/1977 | Kannam | 357/34 |
| 4,231,059 | 10/1980 | Hower et al. | 357/36 |
| 4,253,105 | 2/1981 | Olmstead et al. | 357/36 |

*Primary Examiner*—William D. Larkins
*Attorney, Agent, or Firm*—Birgit E. Morris; Donald S. Cohen; Kenneth R. Glick

[57] ABSTRACT

A semiconductor power device comprises a semiconductor pellet having first and second opposing major surfaces, including, in series, emitter, base and collector regions of alternate conductivity type. The collector region is substantially planar and adjacent to the second surface, the base region is adjacent to the collector region and extends to the first surface, and the emitter region extends relatively deeply into the pellet from the first surface and is substantially surrounded by the base region. The emitter region substantially surrounds a substantially centrally located extension of the base region, this extension being of relatively high resistance and also terminating at the first surface. An emitter electrode contacts the emitter region and the base region extension, a collector electrode contacts the collector region, and a base electrode contacts the base region.

10 Claims, 4 Drawing Figures

SEMICONDUCTOR POWER DEVICE HAVING SECOND BREAKDOWN PROTECTION

BACKGROUND OF THE INVENTION

This invention relates to semiconductor devices used in high power switching applications. More specifically, it relates to bipolar power transistors such as those used in transcalent devices.

Bipolar transistors operated at high power densities are subject to a failure mode termed second breakdown. This breakdown is characterized by a sudden decrease in emitter-collector voltage and a simultaneous increase in emitter current, such that unless the power is rapidly removed, the device will be destroyed or significantly degraded by overheating. Second breakdown is caused by current concentrations in local areas of the emitter/base junction creating local overheating. Once a localized hot spot occurs, positive thermal feedback begins; the hot region injects more, thereby getting hotter, thereby injecting more. If the available power is limited, the peak temperature remains below a critical value. However, if the peak temperature reaches a value such that local base-collector leakage current reaches base current magnitude, the device regenerates into second breakdown.

Second breakdown can occur during either forward or reverse bias and typically initiates at a central portion of the emitter/base junction area. Various forms of series resistance emitter ballasting and base ballasting have been suggested in an effort to reduce hot spot formation, although they have been only partially effective in protecting against reverse bias second breakdown. Shorting the base to the emitter through a resistance is another known technique for generally improving second breakdown characteristics of power transistors. However, this technique, known as shunt ballasting, is not wholly satisfactory because the base region typically has a relatively low resistivity, thereby permitting an excessive base shunt current which degrades the transistor current gain (hFE).

The present invention discloses a shunt ballasting structure which provides forward and reverse second breakdown protection with no significant degradation in current gain at normal power operating levels.

SUMMARY OF THE INVENTION

A semiconductor power device includes a semiconductor pellet having first and second opposing major surfaces and emitter, base and collector regions of alternate conductivity type arranged in series. The collector region is substantially planar and is adjacent to the second surface. The base region is adjacent to the collector region and extends to the first surface. The emitter region extends relatively deeply into the pellet from either the first surface or a mesa on the first surface and it is substantially surrounded by the base region. The emitter region substantially surrounds a substantially centrally located extension of the base region which is of relatively high resistance and also extends to the first surface (or the surface of the mesa). Emitter, base and collector electrodes contact their respective semiconductor regions, the emitter electrode contacting the base extension as well.

DETAILED DESCRIPTION

Figure 1:
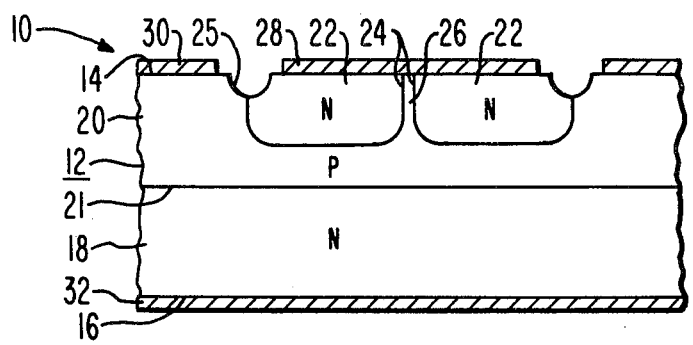
FIG. 1 is a cross-sectional view of a semiconductor device incorporating the present invention.

FIG. 1 is a cross-sectional view of the present invention embodied in a power transistor 10. The transistor 10 comprises a semiconductor pellet 12 having first and second opposing major surfaces, 14 and 16 respectively. The pellet 12 includes a substantially planar collector region 18, of first conductivity type, which terminates at the second surface 16 and a base region 20, of second conductivity type, disposed across the collector and extending to the first surface 14. A PN junction 21 is formed at the collector/base interface. An emitter region 22 extends into the pellet 12 from the first surface 14, forming an emitter/base PN junction 24. In the preferred embodiment, a moat 25 adjacently surrounds the emitter region such that the PN junction 24 terminates at the moat. However, although the moat 25 can enhance device performance, it is not necessary to the invention.

It should be noted that the transistor 10 illustrated in FIG. 1 incorporates a single emitter region 22. The base region 20 has a portion 26 which extends to the first surface 14 within the boundaries of the emitter region 22, FIG. 1 representing a cross-sectional view taken through this base region extension 26. It is essential that the base region extension 26 be of relatively high resistance, as measured from the first surface 14 to the bulk of the base region in the interior of the pellet 12. This can be achieved geometrically, utilizing a base region extension 26 having a relatively long major axis substantially perpendicular to the first surface 14 and a relatively small cross-sectional area parallel to the first surface 14. For example, in an ideal embodiment, the base region extension 26 would be of substantially columnar shape.

Optimally, the base region extension 26 is centrally located in the emitter region 22, and moreover, the emitter region can contain a plurality of centrally located base region extensions. In a preferred configuration, the emitter region 22 has a finger-like shape at the first surface 14 and a plurality of relatively small diameter base extensions 26, disposed along the long axis of the finger, extend into the pellet from the first surface.

An emitter electrode 28 is ohmically disposed on the first surface 14 such that it overlies the emitter region 22 and base region extension(s) 26, and shorts the emitter/base junction 24. A base electrode 30 contacts the bulk of the base region 20, for example, at the first pellet surface 14, and a collector electrode 32 contacts the collector region, for example, at the second pellet surface 16.

Figure 2:
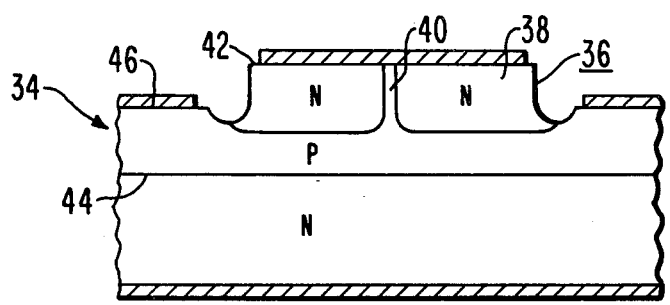
FIG. 2 is a cross-sectional view of an alternative embodiment of the present invention.

An alternate embodiment of a power transistor incorporating the present invention is illustrated in FIG. 2 and is generally designated as 34. Power transistor 34 is substantially similar in structure and function to the power transistor 10 such that the internal structure of transistor 34 need not be described in detail. The primary distinction between the two devices is the presence of a mesa 36 protruding from the first surface 46 of transistor 34. Preferably, the mesa 36 has a surface 42 which is substantially parallel to the first major surface 14, although the mesa surface 42 may be curved as well. The internal structure of the mesa 36 is essentially a continuation of the emitter region 38 and the base region extension 40, both of which terminate at the mesa surface 42.

Figure 3:
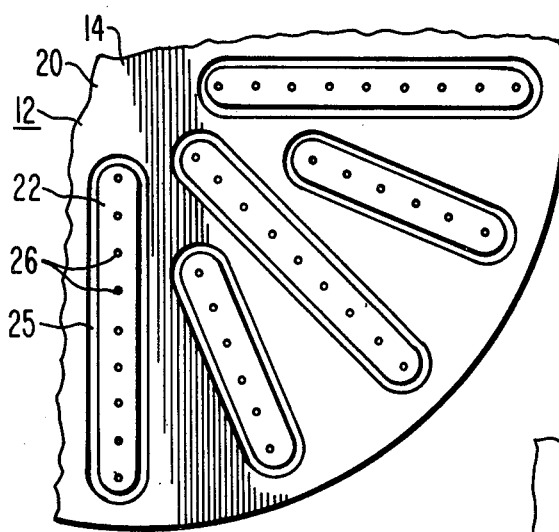
FIG. 3 is a top view of a semiconductor device embodying the present invention.

Although the structures illustrated in FIGS. 1 and 2 represent functional devices, the transistors 10 and 34 can also be incorporated into larger devices. For example, a larger device can include a plurality of portions, each having the sectional view of transistor 10 or 34. FIG. 3 illustrates a first surface 14 view (electrodes not shown) of one such configuration of transistor 10. In this exemplary embodiment, (also applicable to transistor 34), a plurality of finger-like emitter regions 22 are radially disposed on the surface of a semiconductor pellet 12. Each emitter region 22 includes a plurality of base region extensions 26 and is separated from the surrounding base region 20 by a moat 25. It should be recognized, that this embodiment, described with reference to transistor 10, is also applicable to transistor 34, wherein the device would include a plurality of radially disposed finger-like mesas 36.

Figure 4:
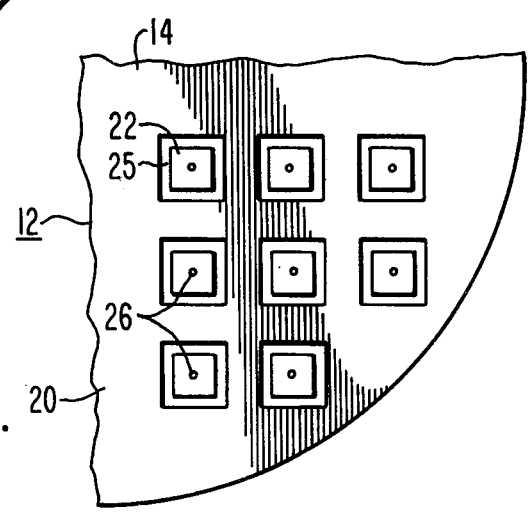
FIG. 4 is a top view of another embodiment of the present invention.

FIG. 4 illustrates another exemplary embodiment for transistor 10 or transistor 34, although it too has been identified with reference to the semiconductor regions of transistor 10. In this configuration, an array of substantially rectangular emitter regions 22 is disposed on the first surface 14 of the pellet 12, each emitter region 22 being separated from the surrounding base region 20 by a moat 25. A base region extension 26 extends into the pellet 12 from substantially the center of each emitter region 22. Additionally, it should be recognized that although the array of emitter regions 22 is illustrated as being uniform, it is not required that the spacings between neighboring emitter regions be equal.

Further elaboration of transcalent device configurations can be obtained with reference to U.S. Pat. No. 4,126,879, Semiconductor Device With A Ballast Resistor Adapted For A Transcalent Device, S. W. Kessler, Jr. et al, Nov. 21, 1978 and U.S. Pat. No. 3,739,235, Transcalent Semiconductor Device, S. W. Kessler, Jr., June 12, 1973.

Additionally, it should be recognized that although FIGS. 1 and 2 have been labeled to illustrate NPN transistors, the invention is not so limited. All indicated conductivity types can be reversed so as to yield PNP transistors if desired.

Devices of the present invention can be formed by methods commonly known in the semiconductor industry. For example, transistor 10 can be fabricated by standard single, double or triple diffusion techniques and transistor 34 can be fabricated utilizing a hometaxial-base process as described in U.S. Pat. No. 2,975,080, Production Of Controlled P-N Junctions, L. D. Armstrong, Mar. 14, 1961. The high resistance base region extensions 26 and 40 can be formed during standard processing, for example, by photolithographically generating small mask areas on a semiconductor surface followed by diffusing relatively deep emitter regions into that surface.

For a device designed to handle more than approximately 100 watts, typical emitter finger dimensions on the first surface of the planar transistor 10 are 0.006–0.010 in. (152–254$\mu$) by 0.2–0.9 in. (5.1–22.9 mm). The pellet is typically approximately 0.008 in. (200$\mu$) thick, the base region might extend to a depth of approximately 0.001–0.002 in. (25–51$\mu$) from the first surface, and the emitter region might extend into the pellet approximately 0.0008 in. (20$\mu$) from the first surface. The moat might be 0.0005 in. (13$\mu$) deep and 0.001–0.002 in. (25–51$\mu$) wide.

For an NPN transistor 10 the resistivity of the P type base will typically vary from approximately 0.03 ohm-centimeters at that portion of the base extension near the pellet surface 14, to approximately 1.0 ohm-centimeters at that portion near the base/collector junction 21. For a PNP transistor 10 the resistivity of the N type base will typically vary from approximately 0.02 ohm-centimeters at that portion of the base extension near the pellet surface to approximately 0.5 ohm-centimeters at that portion near the base/collector junction 21. An effective configuration of the base region extension(s) 26 would include a plurality of equally spaced dots, less than or equal to approximately 0.0008 in. (20$\mu$) in diameter, along the long axis of the emitter region on the first pellet surface. At the first surface, spacing between these base region extension dots should be approximately equal to twice the width of the emitter finger. Preferably, in the described device, a plurality of such emitter fingers are radially disposed on the first surface of the pellet so as to yield approximately 1000 base extensions having a total resistance of 0.02 ohms.

A device incorporating mesas, transistor 34, would have a substantially similar design as transistor 10. The essential distinction is a reduction in the total pellet thickness and the depth of the base/collector junction 44 from the first surface 46. The base/collector junction 44 in transistor 34 can be spaced from the mesa surface 42 the same distance that the base/collector junction 21 of transistor 10 is spaced from the first pellet surface 14. The depth of the emitter region(s) 38 (and base region extension(s) 40), measured from the mesa surface 42, is equivalent to the depth of the emitter region 22, measured from the first surface 14 of transistor 10.

High power switching applications require a device which is capable of switching more than approximately 100 watts. In conventional power transistors, reverse bias second breakdown may occur when collector current continues to flow during emitter/base reverse bias conditions, such as when a transistor operating with an inductive load is turned off. When the emitter/base junction is reverse biased, the edge of the emitter region (near the base electrode at the semiconductor pellet surface) is more rapidly turned off than the emitter center (in the interior of the pellet). The center of the emitter is thus more susceptible to hot spot formation, current hogging, thermal runaway and initiation of second breakdown.

Devices of the present invention are less susceptible to second breakdown because the base region extensions create resistive paths to the central portion of each emitter region. When the devices are forward biased, emitter injection into the base region extensions is discouraged. The central portion of each emitter is thus not turned on as hard as the emitter edges and is therefore less likely to be a location of hot spot formation. When devices of the present invention are reverse biased, the base region extensions provide paths for any charge carriers stored in the base region to travel to the emitter electrode. Thus, the central portion of the emitter region is turned off more rapidly than it would be in a conventional device.

The base region extensions are of high resistance, so they consume a relatively small portion of the base current $I_B$ during normal device operation. Since the power device is operated at relatively high collector current $I_C$, the high current gain hFE ($=I_C/I_B$) is not significantly degraded. However, should significant emitter injection occur from the central portion of the emitter region into the base region extension(s), the base region extension(s) will be conductivity modulated. This conductivity modulation will lower the resistance of the base region extensions, thereby further tending to discourage runaway injection.

The present invention thus provides a novel configuration for a power transistor, producing enhanced second breakdown protection with little degradation of current gain at high power levels.

We claim:

1. A semiconductor power device, comprising:
   a semiconductor pellet having first and second opposing major surfaces and incuding, in series, emitter, base and collector regions of alternate conductivity type;
   the collector region being substantially planar and adjacent to the second surface;
   the base region adjacent to the collector region and extending to the first surface;
   the emitter region extending relatively deeply into the pellet from the first surface and being substantially surrounded by the base region; the emitter region substantially surrounding a substantially centrally located extension of the base region, said extension being of relatively high resistance and extending to the first surface;
   an emitter electrode contacting the emitter region and said base region extension;
   a collector electrode contacting the collector region; and
   a base electrode contacting the base region.

2. The device of claim 1, further comprising:
   a mesa protruding from the first surface and having a mesa surface, said mesa essentially being an extension of the emitter region and the base region extension; and
   the emitter electrode on said mesa surface.

3. The device of claims 1 or 2, wherein the base region extension has a relatively long major axis substantially perpendicular to the first pellet surface and a relatively small cross-sectional area parallel to the first pellet surface.

4. The device of claims 1 or 2, further comprising a plurality of base region extensions, each of which is surrounded by the emitter region.

5. The device of claim 4, wherein the base region extensions are located along a first surface center line of the emitter region.

6. The device of claims 1 or 2, wherein the pellet includes a moat at the periphery of the emitter region at the first surface.

7. The device of claims 1 or 2, wherein the emitter region has a finger-like shape.

8. The device of claim 7, comprising a plurality of finger-like emitter regions radially disposed at the first pellet surface.

9. The device of claims 1 or 2, wherein the emitter region has a substantially rectangular shape.

10. The device of claim 9, further comprising an array of said emitter regions.

* * * * *